Feb. 26, 1957 T. H. BONN 2,783,380

FREQUENCY CONTROLLED TRANSISTOR OSCILLATOR

Filed Oct. 3, 1955 4 Sheets-Sheet 1

INVENTOR.
THEODORE H. BONN
BY
Charles G. English
AGENT

Feb. 26, 1957 T. H. BONN 2,783,380

FREQUENCY CONTROLLED TRANSISTOR OSCILLATOR

Filed Oct. 3, 1955 4 Sheets-Sheet 2

INVENTOR.
THEODORE H. BONN

BY Charles C. English

AGENT

Feb. 26, 1957 T. H. BONN 2,783,380

FREQUENCY CONTROLLED TRANSISTOR OSCILLATOR

Filed Oct. 3, 1955 4 Sheets-Sheet 3

INVENTOR

THEODORE H. BONN

BY *Charles C. English*

AGENT

Feb. 26, 1957 T. H. BONN 2,783,380

FREQUENCY CONTROLLED TRANSISTOR OSCILLATOR

Filed Oct. 3, 1955 4 Sheets-Sheet 4

INVENTOR

THEODORE H. BONN

BY Charles C. English

AGENT

United States Patent Office 2,783,380
Patented Feb. 26, 1957

2,783,380

FREQUENCY CONTROLLED TRANSISTOR OSCILLATOR

Theodore H. Bonn, Philadelphia, Pa., assignor to Sperry Rand Corporation, New York, N. Y., a corporation of Delaware Application October 3, 1955, Serial No. 538,185

17 Claims. (Cl. 250—36)

The present invention relates to oscillators of the variable frequency type and is more particularly concerned with an improved transistor oscillator whose frequency can be readily controlled thereby to effect an improved modulator or to provide frequency or phase synchronization with an auxiliary pulse source.

It is often required to provide a variable frequency oscillator preferably having a substantially square wave output. Such oscillators may, for instance, be employed in magnetic amplifier circuits of the pulse type for providing energization pulses, or in various forms of electronic computers wherein a power supply must be synchronized with, for example, a magnetic drum. In such applications it is essential that the power supply deliver a constant volt-seconds integral and it is further desirable that such oscillators lend themselves to ready synchronization. The present invention accomplishes these purposes in a structure which is simpler, more rugged, and more reliable in operation than has been the case in the past.

It is accordingly an object of the present invention to provide an improved oscillator circuit.

A further object of the present invention resides in the provision of a variable frequency oscillator employing transistors.

Still another object of the present invention resides in the provision of a transistor oscillator whose frequency can be readily controlled to be identical to the frequency of another source and whose phase can also be controlled relative to that of another source.

A further object of the present invention resides in the provision of an improved transistor oscillator wherein the output thereof may be synchronized with computer components such as a magnetic storage drum.

Still another object of the present invention resides in the provision of an improved frequency and phase regulated power supply delivering a constant volt-second integral.

A still further object of the present invention resides in the provision of a transistor circuit capable of being employed as an improved frequency modulator.

Another object of the present invention resides in the provision of improved circuits for synchronizing an oscillator with an auxiliary oscillatory source.

Still another object of the present invention resides in the provision of a transistor oscillator circuit capable of effecting a selectively variable frequency output, which oscillator circuit is more rugged in configuration, simpler in construction and has better operating characteristics than has been the case heretofore.

In accordance with the foregoing objects and advantages, the present invention provides an improved self-excited square wave transistor oscillator employing a pair of transistors connected in push-pull and coupled to a transformer preferably having a core of magnetic material exhibiting a substantially rectangular hysteresis loop. Such oscillators are shown, for instance, in an article entitled "A New Self-Excited Square Wave Transistor Power Oscillator," appearing in the Proceedings of the IRE January 1955, vol. 43, No. 1, at page 99. Transistor oscillators of the type taught in the said article are energized by a source of D. C. potential whereby the oscillator normally exhibits a predetermined output frequency dependent upon the various circuit parameters and particularly dependent upon the magnitude of D. C. source employed. The present invention modifies such known transistor oscillators by including means whereby the D. C. source may be selectively varied in potential and this variation in potential may be in response to signals to be transmitted, thereby to provide an improved frequency modulator; or the potential may be varied in accordance with a control signal effected by frequency and/or phase comparison with an auxiliary source thereby to provide synchronization of the oscillator with said auxiliary source.

The foregoing objects, advantages, construction and operation of the present invention will become more readily apparent from the following description and accompanying drawings in which.

Figure 1:
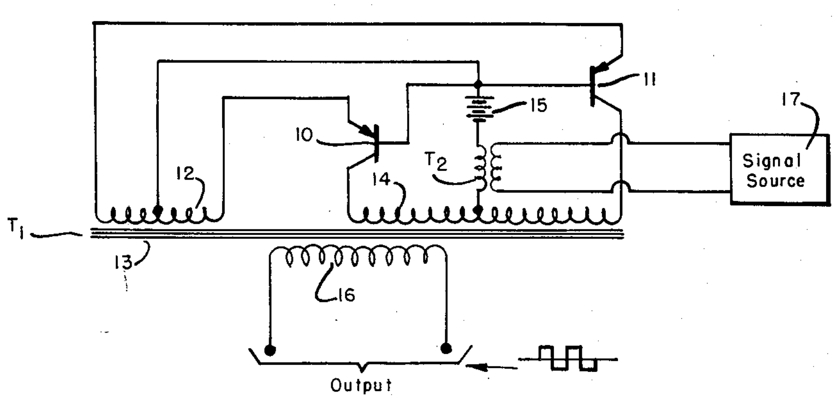
Figure 1 is a schematic diagram of an improved transistor oscillator constructed in accordance with the present invention and capable of operation as a frequency modulator.

Referring now to Figure 1, it will be seen that in accordance with the present invention an improved variable frequency transistor oscillator may comprise a pair of transistors 10 and 11 interconnected in a push-pull grounded base arrangement. The emitters of the said oscillators are coupled as shown to a feedback winding 12 on a transformer T1 having a core 13 preferably exhibiting a substantially rectangular hysteresis loop, and the collectors of the said transistors are coupled to opposing ends of a primary winding 14. The said primary winding 14 is center tapped as shown and a source of D. C. potential 15 is connected as illustrated between the said center tap and the common base connection of transistors 10 and 11 whereby outputs which are essentially square wave in configuration appear across an output winding 16 transformer coupled to primary winding 15.

In the operation of a circuit such as has been thus far described, one of the transistors 10 and 11 is caused to commence conduction more heavily than the other of said transistors 10 and 11 due to inherent unsymmetry in the circuit, and this increased conduction, for instance of the transistor 10, is continually aided by feedback from winding 12 until the transformer core 13 is caused to saturate in a given orientation. During this conduction of transistor 10, for instance, the transistor 11 is maintained in a non-conductive state whereby an output pulse having a susbtantially square wave configuration of a given polarity is attained until the transformer core 13 saturates. Upon such saturation of core 13, the magnetic field tends to collapse whereby the circuit reverses in operation and the transistor 11 is rendered conductive while transistor 10 is rendered non-conductive, thereby to effect a further square wave output of opposite polarity until core 13 once more saturates in the opposite orientation. Thus by the arrangement illustrated, regularly occurring positive and negative going square wave pulses appear across output winding 16 and the transitions between the positive and negative halves of the square wave are effected when the core 13 reaches saturation in one or the other of its orientations. It must be noted that inasmuch as the core 13 determines the reversals in polarity of the output pulse, the output volt-seconds of the oscillator will be constant regardless of the voltage of source 15.

In known forms of the oscillator thus far described and illustrated in Figure 1, the source 15 is the only source provided and this source is ordinarily of constant magnitude whereby the output frequency of the oscillator is also constant in magnitude. In accordance with the improved oscillator of the present invention, however, an auxiliary signal source is interposed in the center tap connection of primary winding 14 and this auxiliary source is caused to selectively aid or oppose the source 15 whereby the output frequency of the oscillator is caused to vary in a desired manner.

In the particular example illustrated in Figure 1, a further transformer T2 is inserted in series with D. C. source 15 and this transformer T2 is coupled as shown to a signal source 17. The source 17 may comprise, for instance, a voice frequency signal or may in the alternative take the form of a signal such as may be provided in telemetering applications. Other forms of signal may naturally be utilized, but in any event the signals provided by source 17 selectively change the effective potential between the center tap of primary winding 14 and the common base connection of transistors 10 and 11, thereby to change the output frequency of transformer T1 while maintaining the volt-seconds integral of this output constant. It must be understood that the transformer T2 is merely illustrative of one form of signal coupling which may be employed and other forms of coupling may be substituted whereby direct coupled or capacitively coupled arrangements are provided. The transformer T2 may also be replaced, for instance, by a vacuum tube, transistor, or other variable impedance element, and in each of those forms of the invention the effective potential of the oscillator energization source is varied in response to a signal input whereby the output frequency of the said oscillator is similarly varied in response to such a signal input. The arrangement of Figure 1 thus provides a circuit capable of being employed as a simple and reliable frequency modulator.

The signals which may be employed for varying the output frequency of the transistor oscillator may also comprise control signals effected by a frequency and/or phase comparison between the outputs of the transistor oscillator and an auxiliary oscillatory output thereby to provide frequency and/or phase synchronization of the transistor oscillator with such auxiliary source. This particular form of the invention is especially valuable in computer applications inasmuch as it is highly desirable, if not absolutely essential, to provide such synchronization for proper operation of the computer. An arrangement operating in accordance with this latter form of the invention is illustrated in Figure 2 and like numerals have been employed to designate those like elements already described in reference to Figure 1.

In accordance with this improved form of the present invention the variable potential source inserted in series with D. C. source 15 has been designated by a block 18 and the output of this variable potential source 18 is selectively controlled by signals coupled thereto from a frequency and phase comparator 19, the output of which is in turn dependent upon a comparison between the outputs appearing across transformer T1 output winding 16 and the outputs of an auxiliary source 20. In accordance with the embodiment thus illustrated in Figure 2, the output frequency and/or phase of signals appearing across winding 16 may be readily controlled or synchronized with those from an auxiliary source 20.

Figure 2:
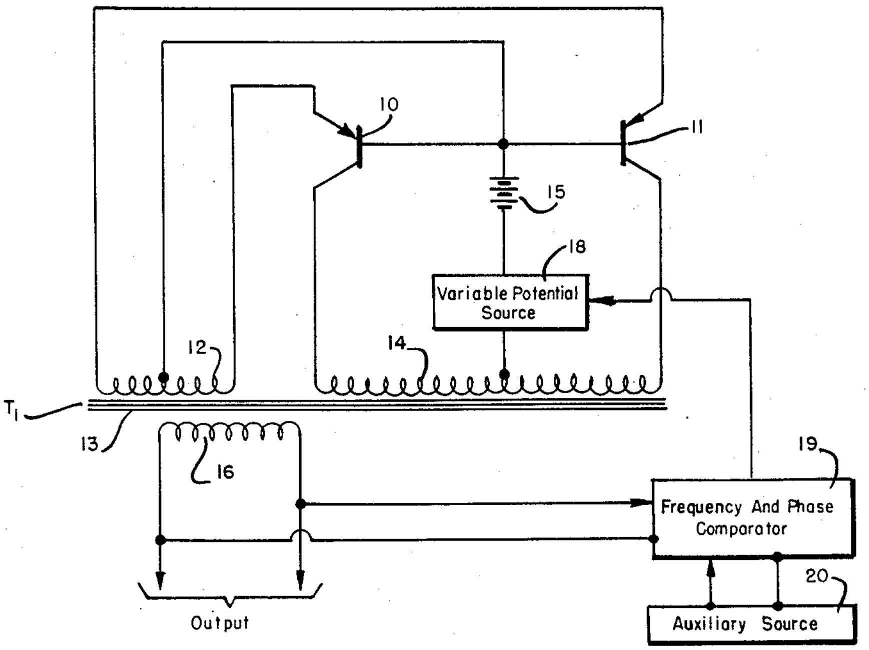
Figure 2 is a generic representation of an improved transistor oscillator capable of frequency and/or phase synchronization with an auxiliary source.
Figure 3:
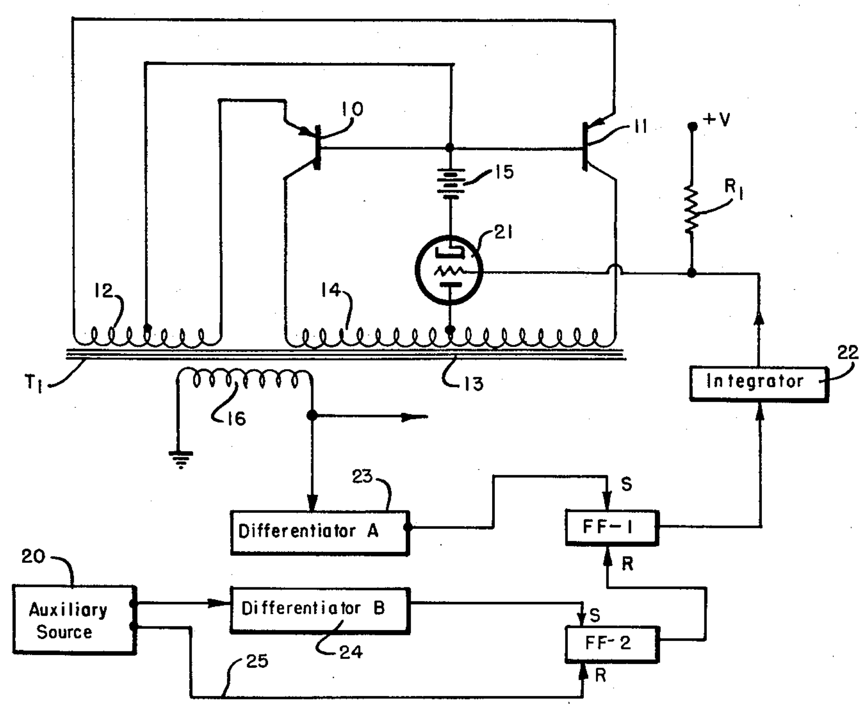
Figure 3 is a schematic diagram of one form of synchronized oscillator constructed in accordance with Figure 2.

One form of synchronization circuit operating in this manner has been illustrated in Figure 3 and once more like numerals have been employed to designate those like components already described in Figures 1 and 2. Referring to Figure 3, it will be seen that the variable potential source cooperating with D. C. source 15 takes the form of a vacuum tube 21 having its control grid coupled to the output of an integrator 22. The output pulses appearing across transformer output winding 16 are coupled to a differentiator 23, termed "Differentiator A," and similarly the output of auxiliary source 20 is coupled to a further differentiator 24, termed "Differentiator B." The differentiators 23 and 24 are designed to produce a sharp pulse of short duration during the transition of its associated signal souce through zero, for instance, in a positive direction. The output of differentiator 24 is coupled to the set input of a flip-flop FF–2 and the said flip-flop FF–2 is reset by negative going transitions of the auxiliary source 20 appearing for instance on a further output line 25 of the said source 20. Output pulses appearing from differentiator 23 are similarly coupled to the set input of a flip-flop FF–1 and the said flip-flop FF–1 is reset by positive going outputs from the flip-flop FF–2.

The circuit arrangement is such that the flip-flop FF–1 produces an output pulse of predetermined amplitude but of a variable width corresponding to the amount that the oscillator output appearing across winding 16 leads the oscillatory output of auxiliary source 20. This variable width output is thereafter integrated by integrator 22 to provide a control signal on vacuum tube 21 serving to delay the output of the transistor oscillator until desired synchronization is obtained. The frequency and phase comparator comprising differentiators 23 and 24 and flip-flops FF–1 and FF–2 in combination with integrator 22 in effect produces a control voltage which varies the energization voltage between the common base connection of transistors 10 and 11 and the center tap of primary winding 14, and inasmuch as the volt-seconds output of the main oscillator is constant, this variation in energization potential in turn varies the frequency of the output. It will be appreciated that the control is effected in such a manner that the frequency of pulse outputs appearing across source 16 is equal to that of the auxiliary source 20. When the frequency of the output is identical to that of the auxiliary source, then of course the phase difference between the source 16 and auxiliary source 20 can be controlled.

Figure 4:
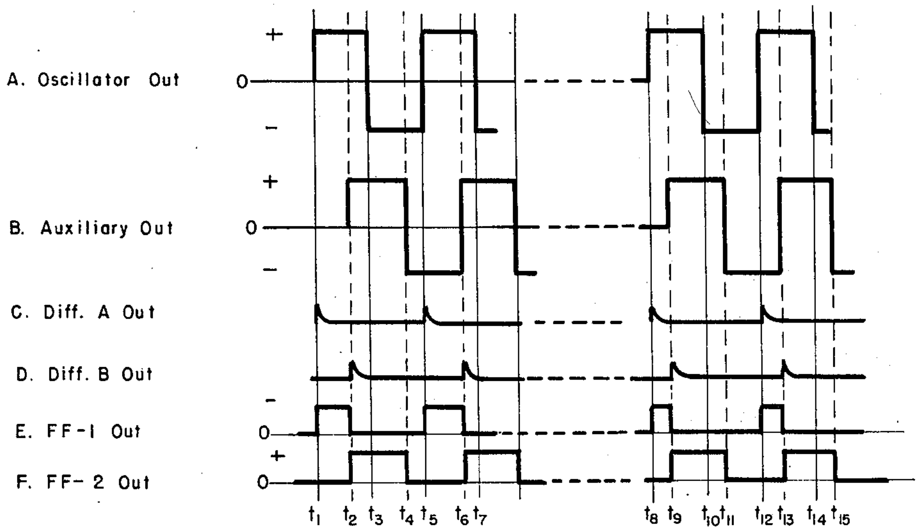
Figure 4 (A through F) are waveforms illustrating the operation of the circuit shown in Figure 3.

The foregoing synchronization operation of the arrangement shown in Figure 3 will become more readily apparent from a consideration of the wave forms shown in Figure 4. Thus, referring to the several waveforms illustrated for the time interval $t1$ to $t7$, it will be seen that the oscillator output (Figure 4A) is initially assumed to lead the auxiliary output from source 20 (Figure 4B) by a relatively large amount approaching 180°, and it has further been assumed that the frequencies of oscillator output and auxiliary output are substantially the same. At time intervals $t1$ and $t5$ the oscillator output appearing across winding 16 exhibits positive going transitions through zero whereby the differentiator 23 produces short pulses at these times $t1$ and $t5$ (Figure 4C). Similarly, the auxiliary output exhibits positive going transitions through zero at times $t2$ and $t6$ whereby differentiator 24 produces further pulses at these time intervals (Figure 4D). The differentiator A output is coupled to the set input of flip-flop FF–1 whereby at time $t1$, for instance, the flip-flop FF–1 effects a negative going set output. This negative going output of flip-flop FF–1 continues until time $t2$ at which time the pulse output from differentiator 24 sets flip-flop FF–2, so that the output of flip-flop FF–2 may in turn reset flip-flop FF–1. Flip-flop FF–2 is later reset, for instance at time *t4*, by the negative going transition of the auxiliary output from source 20.

Thus for the particular arrangement shown, flip-flop FF–1 produces a negative going output having a width *t1* to *t2* (and *t5* to *t6*, etc.) and this negative going output is integrated by integrator 22 and applied to the control grid of vacuum tube 21 thereby to decrease the voltage applied to the core 13 and thus to require an increase in time in order to maintain the constancy of volt-seconds discussed previously. It should be noted that in the particular example illustrated in Figure 3, the output of integrator 22 has been assumed to be a negative potential and this requirement has been further illustrated by causing the control grid of tube 21 to be returned to a source of positive potential +V via a resistor R1.

Due to the integrating function of integrator 22, the actual potential applied to the control grid of tube 21 depends upon the width of error signal produced by flip-flop FF–1, and as the oscillator output and auxiliary output tend to come closer and closer to synchronization with one another, the width of this flip-flop FF–1 output decreases, with an attendent decrease in control signal amplitude from integrator 22. This is further illustrated by the waveforms shown for the time interval *t8* to *t15* in Figure 4 wherein it has been assumed that the oscillator output appearing across winding 16 leads the auxiliary output by an amount smaller than that originally designated by the waveforms for time *t1* to *t7* and for this further operation it will be noted that the flip-flop FF–1 output exhibits a width *t8* to *t9* which is substantially less than the original width *t1* to *t2* whereby the magnitude of control signal output provided by integrator 22 is similarly decreased.

The particular form of control system thus described in reference to Figure 3 provides synchronization between the outputs appearing across winding 16 and the oscillatory outputs of auxiliary source 20. The circuit has been intended to provide absolute time synchronization between these two signal sources but it will be appreciated that if a fixed delay is required between the two sources it is possible to accomplish such a delay by inserting a delay line equal to the desired delay in the output of differentiator 23 or in the output of differentiator 24, or both. In the event that a delay line is to be inserted in the output of differentiator 24, a further delay line should be inserted in line 25 so that the set and reset signals applied to flip-flop FF–2 are always 180° out of phase.

The control system described in reference to Figure 3 exerts control only for phase differences less than 180° between the auxiliary source and the output. Obviously more complicated control systems can be devised in which the control occurs at other axis crossings than the positive axis crossings and still further variations in the circuit may be effected to provide any form of synchronization or frequency control as may be desired in a given application.

The circuit thus far described in reference to Figure 3 has a further limitation, in that it provides synchronization only when the oscillator output appearing across winding 16 leads the auxiliary output from source 20, for if the auxiliary output should in fact lead the oscillator output, the flip-flop FF–2 will be maintained in a reset condition thereby to keep flip-flop FF–1 in a reset condition during those times when differentiator 23 is producing an output tending to set flip-flop FF–1. If it is desired to provide synchronization between the two sources without regard to which leads the other, an arrangement such as has been illustrated in Figure 5 may be employed.

Figure 5:
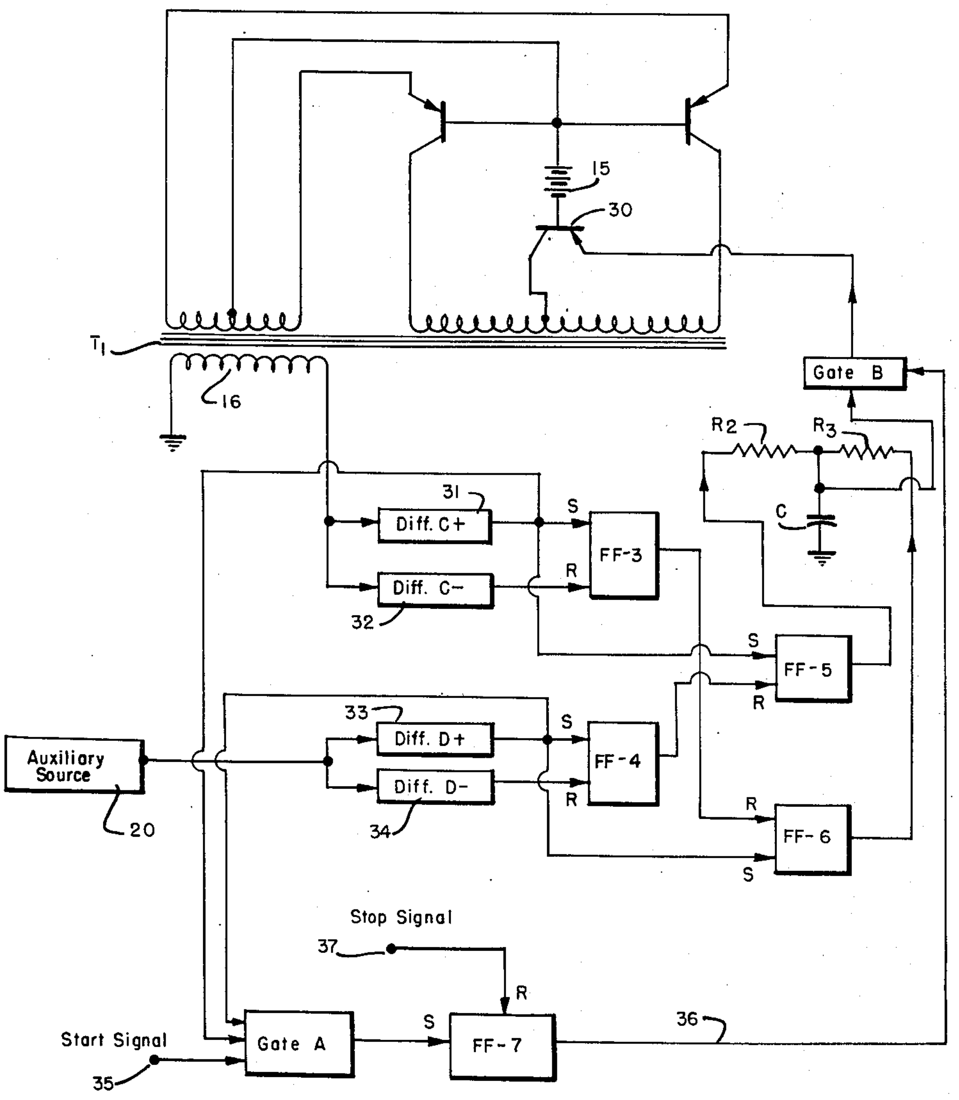
Figure 5 is a schematic diagram of a further synchronized transistor oscillator in accordance with the embodiment of Figure 2.

The square wave oscillator comprising transformer T1 may take the forms already discussed and in the particular embodiment of Figure 5, a further transistor 30 has been inserted in series with D. C. source 15 to provide the desired variable potential source discussed previously. Such a transistor 30 may of course be utilized in providing the control desired for the other circuits already described or for modifications thereof. As before, the oscillator provides a square wave output appearing across output winding 16 and in the particular example of Figure 5 this output is coupled to two differentiators 31 and 32 termed "Diff. C+" and "Diff. C−" respectively, thereby to produce sharp pulses during both the positive going and negative going transitions of the oscillator output at winding 16. The outputs of differentiators 31 and 32 are coupled to the set and reset terminals respectively of a flip-flop FF–3, whereby the output of flip-flop FF–3 comprises a pulse having the same width as that of the output pulse appearing across winding 16. Auxiliary source 20 similarly has its output coupled to a further pair of differentiators 33 and 34 termed "Diff. D+" and "Diff. D−" respectively whereby once more short pulses are produced by the differentiators 33 and 34 for both positive going and negative going transitions of auxiliary source 20. The outputs of differentiators 33 and 34 are similarly coupled to the set and reset terminals respectively of a flip-flop FF–4.

Two further flip-flops FF–5 and FF–6 are provided and the set input of flip-flop FF–5 is coupled to the output of differentiator 31 while the reset input of the said flip-flop FF–5 is coupled to the output of flip-flop FF–4. Similarly, the set input of flip-flop FF–6 is coupled to the output of differentiator 33 while the reset input of the said flip-flop FF–6 is coupled to the output of flip-flop FF–3. As will be described subsequently, this arrangement causes flip-flop FF–5 to produce an output pulse of constant amplitude and of a predetermined polarity when the oscillator output appearing across terminal 16 leads that of auxiliary source 20 and the said output of flip-flop FF–5 exhibits a variable width depending upon the amount of this lead. Similarly, the output of flip-flop FF–6 comprises a pulse having a constant amplitude but a polarity opposite to that of flip-flop FF–5, and flip-flop FF–6 produces such an output when the auxiliary source 20 leads the oscillator output appearing across winding 16. Again the width of flip-flop FF–6 output is a variable depending upon the amount that the auxiliary source might lead the oscillator source.

The output of flip-flop FF–5 is coupled to an integrator comprising a resistance R2 and a capacitor C, while the output of flip-flop FF–6 is coupled to a further integrator comprising resistance R3 and the said capacitor C and the potential appearing across capacitor C thus comprises a variable potential signal of a predetermined one of two possible polarities depending upon which of the sources 20 and 16 leads the other. This potential appearing across capacitor C may thus be coupled to transistor 30 (via a gate B to be described), thereby to provide the frequency control already discussed.

Figure 6:
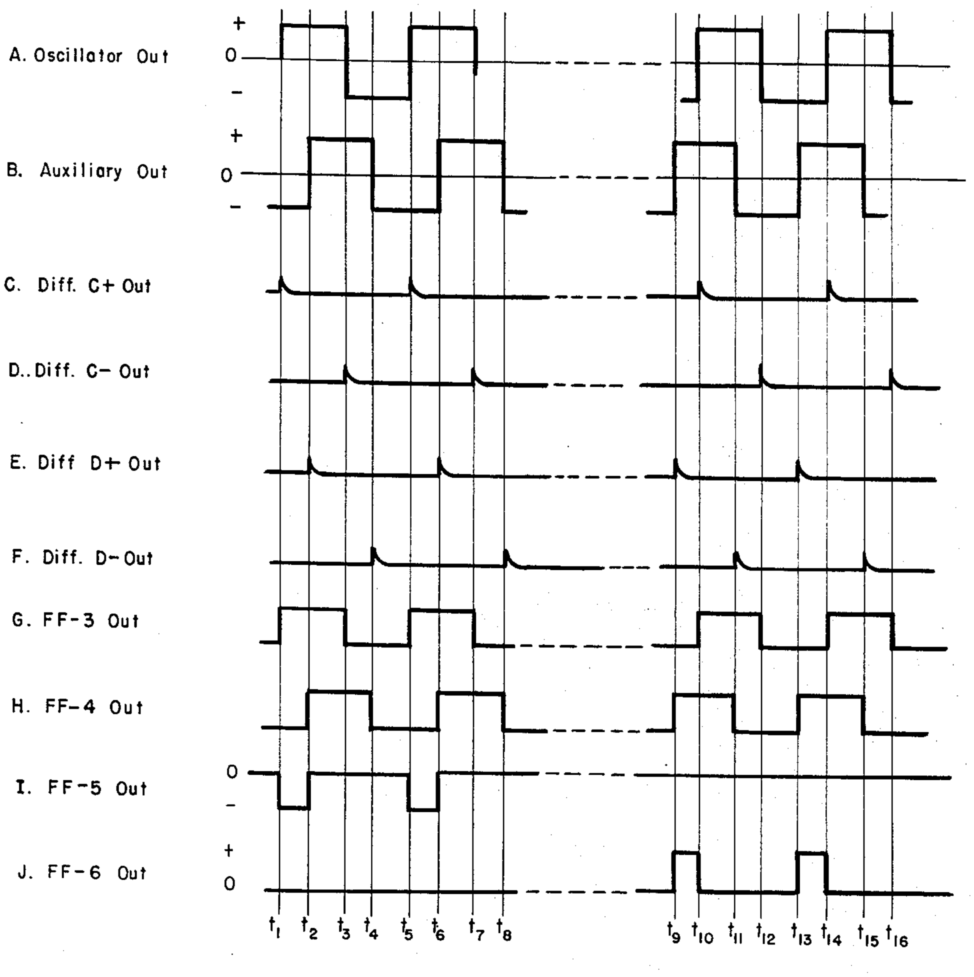
Figure 6 (A through J) are waveforms illustrating the operation of the circuit shown in Figure 5.

The foregoing operation of the circuit described in reference to Figure 5 will become more readily apparent from an examination of the waveforms shown in Figure 6 and these waveforms have been so chosen that the operation of the circuit for the time interval *t1* to *t8* corresponds to that wherein the oscillator output leads the auxiliary output, while the operation depicted for the time interval *t9* to *t16* corresponds to that wherein the oscillator output lags the auxiliary output. Referring to the first assumed operation corresponding to time interval *t1* to *t8*, it will be seen that at times *t1* and *t5* the oscillator effects positive going transitions through zero (Figure 6A) whereby differentiator 31 produces pulses at these times (Figure 6D). The oscillator effects negative going transitions at times *t3* and *t7* whereby the differentiator 32 produces further pulses at these times *t3* and *t7*. By the same token differentiators 33 and 34 produce pulses at times *t2* and *t6*, and at times *t4* and *t8* (Figures 6E and 6F), under the control of the auxiliary source output (Figure 6B).

The pulse output of differentiators 31 and 32 are coupled to flip-flop FF–3 whereby flip-flop FF–3 produces the waves shown in Figure 6G and similarly flip-flop FF–4 produces the waves shown in Figure 6H under the control of the set and reset outputs produced by differentiators 33 and 34. The differentiator 31 output appearing at time $t1$ sets flip-flop FF–5 while the output of flip-flop FF–4 commencing at time $t2$ resets the said flip-flop FF–5. Thus flip-flop FF–5 produces a negative going output pulse during the time interval $t1$ to $t2$ and this time interval $t1$ to $t2$ corresponds to the amount that the oscillator output appearing across winding 16 leads the auxiliary output of source 20.

It should be noted that for this assumed state of operation wherein the oscillator output leads the auxiliary output only flip-flop FF–5 produces output controlled pulses. Flip-flop FF–6 tends to be set by pulse outputs from differentiator 33 but these set outputs applied to flip-flop FF–6 occur during time intervals when the flip-flop FF–6 is maintained in a reset condition by outputs from flip-flop FF–3. This will be seen by a comparison of Figures 6E and 6G. Thus, for the assumed state of operation wherein the oscillator leads the auxiliary output, a negative going signal is provided by flip-flop FF–5 having a width corresponding to the amount of this lead and this negative going signal is thereafter integrated by integrator R2–C to provide a negative going potential of proper magnitude on the control transistor 30 thereby to once more bring the two oscillator sources into synchronization.

An analogous operation exists when the auxiliary output leads the oscillator output and this operation is illustrated in Figure 6 for the time intervals $t9$ to $t16$. Under this latter assumed state of operation, however, the flip-flop FF–6 produces an output pulse which is positive going in nature and which has a width corresponding to the amount that the auxiliary source leads the oscillator. As before, the flip-flop FF–5 produces no output when the flip-flop FF–6 is in an output producing state. The positive going output from flip-flop FF–6 is integrated by integrator R3–C and is thereafter applied (via gate B) to the transistor 30 to effect a control opposite to that effected by outputs from flip-flop FF–5. Thus the desired synchronization is effected regardless of which of the two oscillator outputs is leading the other.

The foregoing synchronized transistor oscillator may of course be employed in various applications without further refinement. Under some circumstances, however, it may be desirable to prevent the synchronization control from commencing unitl a predetermined time and this is particularly the case when the auxiliary source, for instance, requires a finite time to build up to a desired frequency. For example, in starting a computer having a drum storage unit, it may be undesirable from the point of view of other circuits in the computer to start the synchronization control described above until the drum is up to speed and until it is known that the frequency of the auxiliary source is within the control range of the oscillator circuit. Under such circumstances, a further controlling network may be employed, and in the particular example shown in Figure 5 such a network comprises gate A, gate B and flip-flop FF–7 interconnected as shown.

Gate A is coupled as indicated to the output of differentiators 31 and 33 and is also coupled to a starting signal source 35. The gate A is of a permissive type and produces no output until there is a simultaneity of the three possible inputs thereto. Thus gate A will produce no output until a starting signal is applied and until the outputs from auxiliary source 20 and those appearing across oscillator output winding 16 coincide in time. Upon such coincidence of outputs in combination with a starting signal applied to terminal 35, gate A produces an output which sets flip-flop FF–7 thereby to apply a signal via line 36 to the gate B. This latter signal opens gate B permitting synchronizing control signals which appear across capacitor C to pass via gate B to the variable potential source comprising transistor 30. This state of affairs will continue until flip-flop FF–7 is reset by application of a stop signal, for instance to terminal 37.

Still further modifications will be suggested to those skilled in the art. For instance, it should be noted that in each of the embodiments described, the variable impedance or variable potential element has been inserted in series with the constant D. C. source of the transistor oscillator. Such a variable impedance element may in fact be placed in series with each of the transistors, however, whereby the circuit would comprise two variable impedance elements arranged in the indicated manner. Although such a configuration will be somewhat more expensive than those already described, it may be desirable in certain applications. Other modifications have also been discussed in respect to the types of variable impedance or variable potential elements which can be employed as well as to possible arrangements of such elements in respect to the energization source of the oscillator. Additional modifications could include the provision of different and perhaps more complicated integrating circuits than those comprising, for instance, resistances R2 and R3 in combination with capacitor C (Figure 5). Still further modifications will be suggested to those skilled in the art and it must therefore be stressed that the foregoing discussion is meant to be illustrative only and should not be considered to be limitative of my invention. All such modifications as are in accordance with the principles described are meant to fall within the scope of the appended claims.

Having thus described my invention, I claim:

1. In an oscillator, a transformer having a first winding, an output winding and a feedback winding thereon, a pair of transistors coupled to opposing ends of said first winding, means coupling said feedback winding to said pair of transistors, a variable potential source coupled between each of said pair of transistors and a center-tap on said first winding, and signal means for changing the magnitude of said variable potential source.

2. The oscillator of claim 1 wherein said variable potential source comprises a source of substantially constant potential connected to a signal responsive variable impedance.

3. The oscillator of claim 2 wherein said variable impedance comprises a further transistor.

4. The combination of claim 1 including an auxiliary oscillator, and frequency comparison means coupled to said output winding and to said auxiliary oscillator, said signal means comprising means coupled to said comparison means for producing a variable amplitude potential in response to differences between the frequency of said auxiliary oscillator and the frequency of oscillator signals in said output winding.

5. The combination of claim 1 including an auxiliary oscillator having substantially the same output frequency as that of said first-mentioned oscillator, phase comparison means coupled to said auxiliary oscillator and to said output winding, said signal means comprising means coupled to said comparison means for producing a variable amplitude potential in response to variations in phase between the outputs of said auxiliary oscillator and of said first-mentioned oscillator.

6. The combination of claim 5 wherein said signal means comprises means producing a variable amplitude potential of variable polarity in dependence upon the lead or lag of said auxiliary oscillator output in respect to said first-mentioned oscillator output as determined by said phase comparison means.

7. In a transistor oscillator wherein a pair of transistors are connected in push-pull between a transformer center-tapped primary winding and a transformer center-tapped feedback winding, the improvement which comprises a variable amplitude energization source coupled between said push-pull transistors and said primary winding center-tap, and signal control means coupled to said energization source for selectively varying the amplitude of said source.

8. The oscillator of claim 7 wherein said variable amplitude energization source comprises a source of relatively constant D. C. potential, and a signal responsive variable impedance in series with said D. C. source.

9. The oscillator of claim 8 wherein said variable impedance comprises a further transistor.

10. In an oscillator, a transformer having a core of magnetic material exhibiting a substantially rectangular hysteresis loop, a center-tapped primary winding on said core, a feedback winding on said core, an output winding on said core, a pair of transistors each having one electrode coupled to the center-tap of said primary winding via a variable potential D. C. source, said pair of transistors each having another electrode coupled respectively to opposing ends of said primary winding, means coupling opposing ends of said feedback winding to a third electrode of each of said transistors respectively, and signal means coupled to said D. C. source for selectively varying the potential thereof, thereby to vary the oscillatory output appearing across said output winding.

11. The oscillator of claim 10 including an auxiliary oscillatory source, comparison means coupled to said output winding and to said auxiliary source for deriving an error signal dependent upon the phase displacement between signals in said output winding and signals from said auxiliary source, said signal means comprising means coupling said error signal to said D. C. source.

12. The oscillator of claim 11 wherein said comparison means comprises means producing a signal of variable width proportional to the phase displacement between signals in said output winding and signals from said auxiliary source, and integrating means coupled to said variable width signal for producing a variable amplitude signal dependent upon said phase displacement.

13. The oscillator of claim 11 wherein said comparison means comprises means producing a variable width signal of a first polarity when said auxiliary source leads said oscillator output, means producing a variable width signal of the opposite polarity when said auxiliary source lags said oscillator output, and integrator means for converting said variable width signals into variable amplitude error signals.

14. The oscillator of claim 11 wherein said variable D. C. source includes a further transistor.

15. The oscillator of claim 10 wherein said variable D. C. source comprises a constant D. C. source in series with a signal responsive source of variable potential.

16. The oscillator of claim 15 wherein said signal responsive source comprises a further transformer.

17. The oscillator of claim 15 wherein said signal responsive source comprises a further transistor.

No references cited.